(12) United States Patent
Menke et al.

(10) Patent No.: US 6,466,493 B1
(45) Date of Patent: Oct. 15, 2002

(54) MEMORY CONFIGURATION HAVING REDUNDANT MEMORY LOCATIONS AND METHOD FOR ACCESSING REDUNDANT MEMORY LOCATIONS

(75) Inventors: Manfred Menke; Manfred Plan, both of München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/690,298

(22) Filed: Oct. 17, 2000

Related U.S. Application Data

(63) Continuation of application No. PCT/DE99/01181, filed on Apr. 16, 1999.

(30) Foreign Application Priority Data

Apr. 17, 1998 (DE) .................................. 198 17 159

(51) Int. Cl.$^7$ ................................................ G11C 7/00
(52) U.S. Cl. .............. 365/200; 365/189.07; 365/230.03
(58) Field of Search ............................ 365/200, 189.07, 365/230.03, 189.01, 280.01

(56) References Cited

U.S. PATENT DOCUMENTS

| | | | | |
|---|---|---|---|---|
| 4,051,354 A | | 9/1977 | Choate ........................ 235/312 |
| 4,807,191 A | * | 2/1989 | Flannagan ................... 714/711 |
| 5,257,229 A | * | 10/1993 | McClure et al. ............. 365/200 |
| 5,270,975 A | * | 12/1993 | McAdams ................... 365/200 |
| 5,404,331 A | * | 4/1995 | McClure ..................... 365/200 |
| 5,475,648 A | * | 12/1995 | Fujiwara ................ 365/230.06 |
| 5,715,202 A | * | 2/1998 | Harima ........................ 365/200 |
| 5,732,029 A | * | 3/1998 | Lee et al. .................... 365/200 |
| 5,808,948 A | * | 9/1998 | Kim et al. ................... 365/200 |
| 5,970,000 A | * | 10/1999 | Kirihata et al. ............. 365/200 |

FOREIGN PATENT DOCUMENTS

DE    38 27 174 A1    3/1989
EP    0 612 074 A1    8/1994

OTHER PUBLICATIONS

International Publication WO 93/21578 (Rieger et al.), dated Oct. 28, 1993.

* cited by examiner

*Primary Examiner*—Hoai Ho
(74) *Attorney, Agent, or Firm*—Laurence A. Greenberg; Werner H. Stemer; Gregory L. Mayback

(57) ABSTRACT

A memory configuration is divided into memory blocks and allows a flexible access to redundant memory locations by using both, redundant column lines and redundant row lines of a particular memory block to repair defects of another memory block. Thus more defects can be repaired in the other memory block than there are redundant memory locations present in the other memory block. A method of accessing redundant memory locations is also provided. The memory configuration and the method of accessing redundant memory locations can be used in all memory architectures that write or read one or more bits of information per address in a parallel manner.

13 Claims, 2 Drawing Sheets

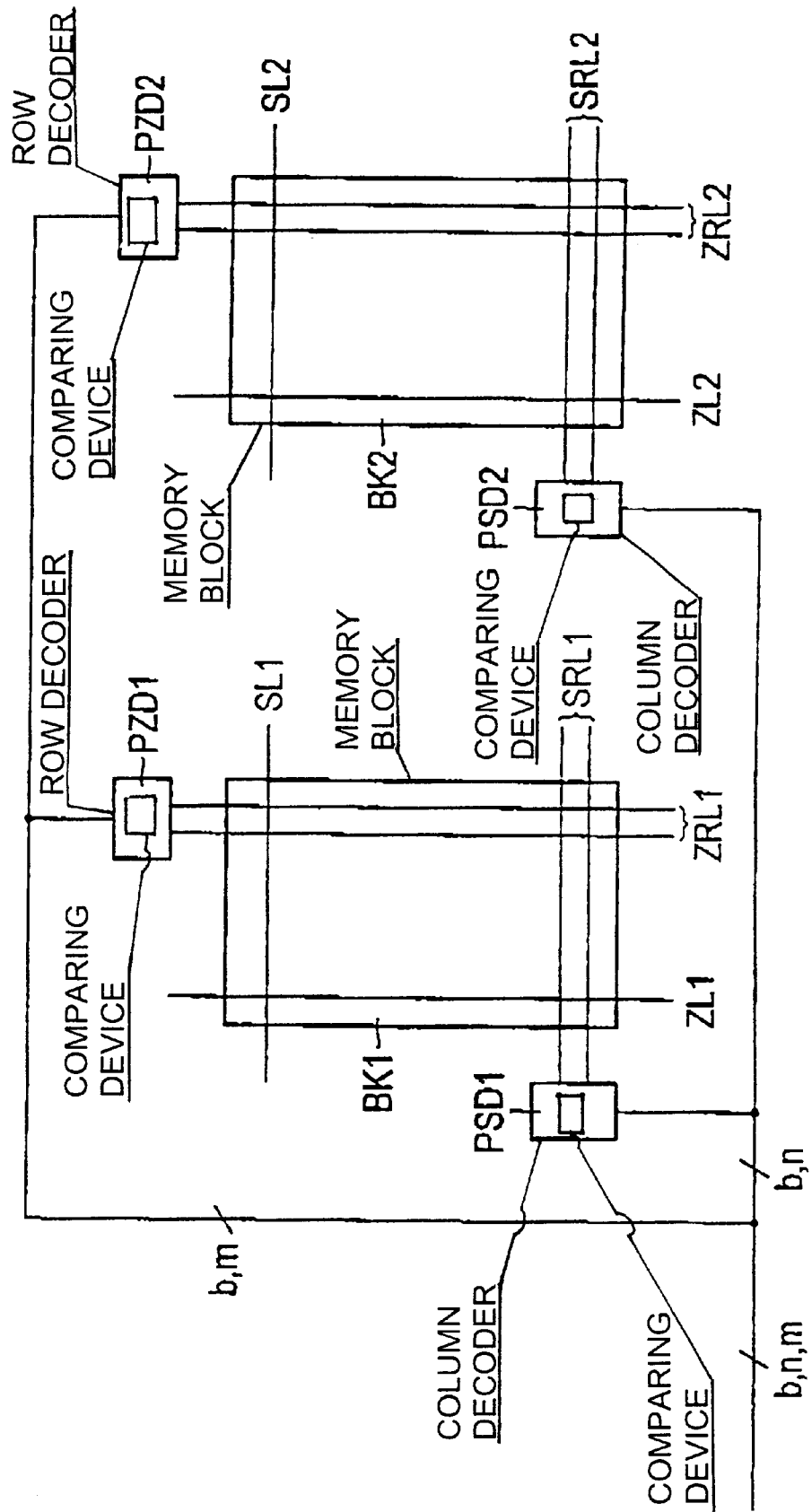

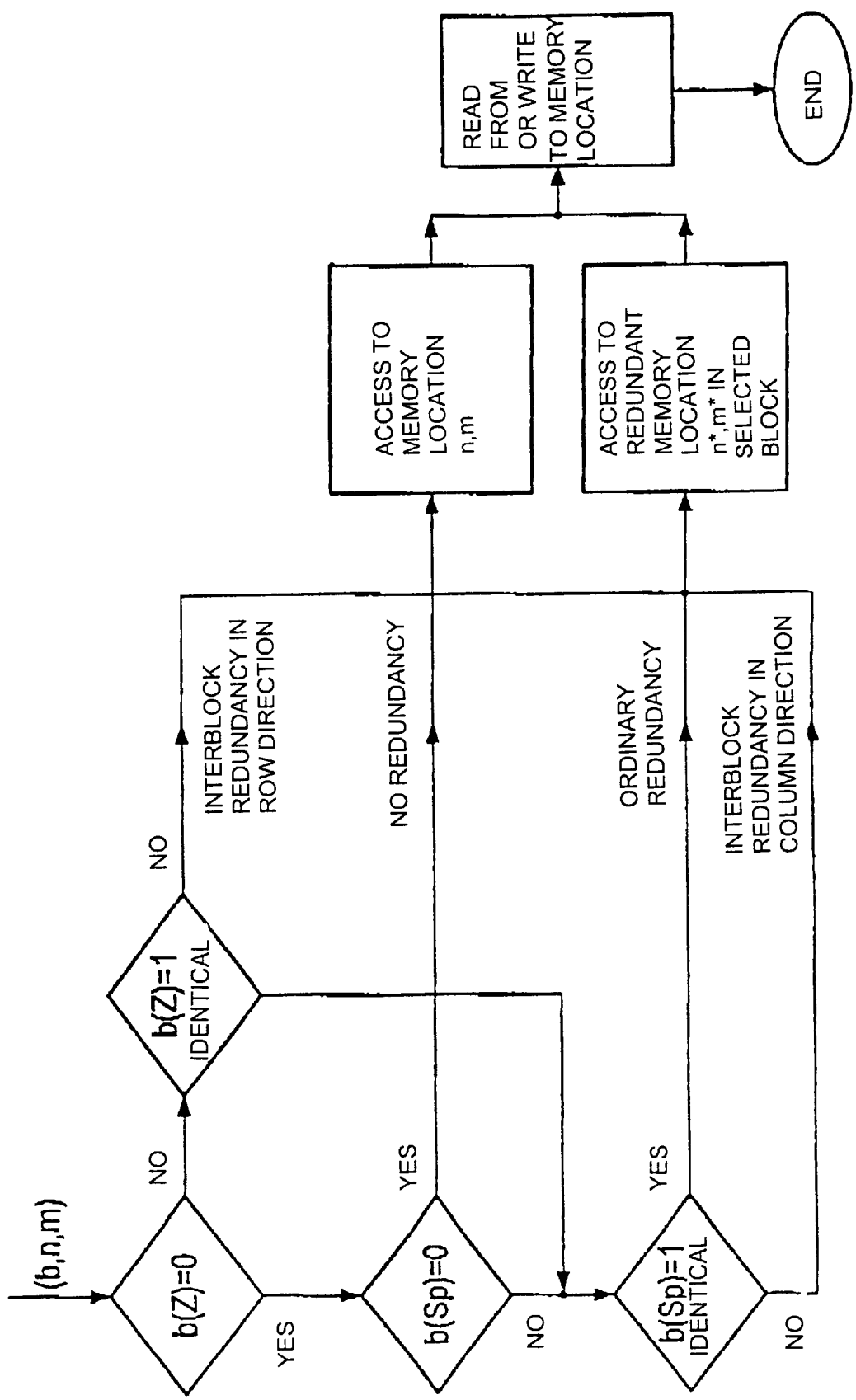

MEMORY CONFIGURATION HAVING REDUNDANT MEMORY LOCATIONS AND METHOD FOR ACCESSING REDUNDANT MEMORY LOCATIONS

CROSS-REFERENCE TO RELATED APPLICATION

This application is a continuation of copending International Application No. PCT/DE99/01181, filed Apr. 16, 1999, which designated the United States.

BACKGROUND OF THE INVENTION

FIELD OF THE INVENTION

The invention relates to a memory configuration having memory blocks with redundant memory locations that can be selected via addresses. The invention also relates to a method for accessing redundant memory locations that are provided in columns and rows in a memory configuration having memory blocks.

Information, which is stored in a memory, is deposited in individual memory locations which are provided in a location field having columns and rows. Each memory location can be selected for reading or writing via column and row address lines with the aid of an address that is assigned to the location. To this end, the address lines are connected to column and row decoders. These decode the supplied address and activate column and row address lines corresponding to the address.

As a consequence of the high integration density and the ever smaller grid dimensions, there is an increased susceptibility to defects in the location field, such as defective memory locations or damaged address lines. In order to guarantee a certain minimum capacity of the memory given a definite number of defects, devices are usually provided for replacing the defects. Usually these devices are additional memory locations that can be used in place of the defective locations with the aid of programmable coding elements.

In memories of higher capacity, the memory locations are split into several blocks. Because of the matrix-type configuration of the memory locations, the additional locations must likewise be provided in rows and columns. Using a programmable element, additional lines appertaining to the additional locations are selected in dependence upon the applied address. These elements are programmed via what are known as fuse banks, which contain laser-separable connections. In a test of the memory the addresses that are assigned to defective memory locations are discovered. The fuse banks are then coded such that the additional (redundant) memory locations are accessed it these addresses.

Published European Patent Application EP 0 612 074 A1, which corresponds to U.S. Pat. No. 5,457,655, teaches a column redundancy circuit configuration having a plurality of memory blocks. The programmable coding elements are not strictly allocated to the blocks. Rather, each of the coding elements contains an address coding device and thus can be allocated to an arbitrary memory block.

Experiments have shown that defects often occur clustered in one block. On the other hand, other blocks remain free of errors. The typical errors are individual defects that occur along a column address and/or a row address, or a cluster of adjoining individual defects. The location of these clusters can be determined by testing only after the production of the memory.

In order to be able also to eliminate adjoining individual defects such as this by redundant lines, a high number of redundant lines is needed in every block. But this leads to an increase in the surface area of the chip.

International Publication No. WO 93/21578 therefore proposes a memory configuration and a method for accessing redundant memory locations, wherein the originally supplied address is compared to a preprogrammed address by a redundance block decoder, and, if a match is found, a corresponding redundance word line decoder and redundance bit line decoder of the corresponding memory block is actuated to access a redundant memory location that is addressed by the redundance word line decoder and redundance bit line decoder. The redundant memory location can be provided in a different memory block than that of the original location that must be replaced.

SUMMARY OF THE INVENTION

It is accordingly an object of the invention to provide a memory configuration with a redundancy mechanism which overcomes the disadvantages of the heretofore-known memory configurations of this general type and in which the number of defects that can be eliminated with redundant lines is increased without increasing the number of redundant lines per memory block. It is also an object of the invention to provide a method of accessing redundant memory locations.

With the foregoing and other objects in view there is provided, in accordance with the invention, a memory configuration, including:

memory blocks having memory locations and redundant memory locations;

the memory locations and the redundant memory locations being organized in rows and columns and being selectable via respective select addresses;

a programmable row decoder and a programmable column decoder respectively allocated to each of the memory blocks for selecting one of the redundant memory locations in a respective one of the memory blocks;

at lease one of the programmable column decoder and the programmable row decoder of at least a given one of the memory blocks being programmed such that the given one of the memory blocks can be selected with a select address corresponding to another one of the memory blocks for accessing given ones of the redundant memory locations assigned to the another one of the memory blocks;

the programmable column decoder and the programmable row decoder allocated to the given one of the memory blocks each including a comparing device for comparing a given portion of the select address to a corresponding preprogrammed address; and the programmable column decoder and the programmable row decoder allocated to the given one of memory blocks being configured such that the programmable column decoder performs a comparison of the select address to the corresponding preprogrammed address only when the programmable row decoder has not detected a match between the select address and the corresponding preprogrammed address.

The invention has the advantage that a defect in a memory block can be remedied by using the redundant locations of an adjacent memory block. It is thus possible to eliminate more defects in a memory block than there are redundancy lines present in this block.

It is also advantageous that both, redundant column lines and redundant row lines can be used for redundancy.

In accordance with another feature of the invention, the comparing device of the programmable column decoder and the comparing device of the programmable row decoder allocated to the given one of the memory blocks are configured to deny access to the memory locations for the memory blocks except for the given one of the memory blocks, if the comparison of the select address to the corresponding preprogrammed address produces a match.

In accordance with yet another feature of the invention, the select a dress has a first portion for selecting one of the memory blocks, a second portion for selecting one of the columns, and a third portion for selecting one of the rows; the comparing device of the programmable column decoder allocated to the given one of the memory blocks compares the first portion and the second portion of the select address to the corresponding preprogrammed address; and the comparing device of the programmable row decoder allocated to the given one of the memory blocks compares the first portion and the third portion of the select address to the corresponding preprogrammed address.

With the objects of the invention in view there is also provided, a method of accessing redundant memory locations, which includes the steps of:

providing memory locations organized in columns and rows in a memory configuration having memory blocks;

allocating programmable column decoders and programmable row decoders to the memory blocks;

replacing a given one of the memory locations of a given one of the memory blocks by a redundant memory location of another one of the memory blocks by performing a comparison of a select address of the given one of the memory locations to a respectively preprogrammed address of each of the programmable column decoders and to a respective preprogrammed address of each of the programmable row decoders; and performing the comparison to the respective preprogrammed address of the column decoders only when the comparison to the respective preprogrammed address of the row decoders does not result in a match.

In accordance with a further mode of the invention, the memory blocks are selected with a first portion of the select address; the columns of redundant memory locations are selected with a second portion of the select address; and the rows of the redundant memory locations are selected with a third portion of the select address. The first portion and the second portion of the select address are compared to the respective preprogrammed address of each of the programmable column decoders; and the first portion and the third portion of the select address are compared to the respective preprogrammed address of each of the programmable row decoders.

In accordance with another mode of the invention, access to the redundant memory locations of a specific one of the memory blocks is enabled if a match exists for a corresponding portion of the select address and the respective preprogrammed address in one of the column decoders allocated to the specific one of the memory blocks or in one of the row decoders allocated to the specific one of the memory blocks.

In accordance with yet another mode of the invention, a new address is allocated to the second portion and/or the third portion of the select address for accessing one of the redundant memory locations.

The inventive principle can be applied to all memory architectures that write or read one or more bits of information per address in parallel fashion, such as a DRAM (Dynamic Random Access Memory), an eDRAM core (embedded DRAM), an SRAM (Static RAM), a ROM (Read-Only Memory) or an EEPROM (Electrically Erasable Programmable Read Only Memory).

Other features which are considered as characteristic for the invention are set forth in the appended claims.

Although the invention is illustrated and described herein as embodied in a memory configuration having redundant memory locations and a method for accessing redundant memory locations, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a schematic circuit diagram of a memory configuration according to the invention; and FIG. 2 is a flowchart illustrating the method of accessing redundant memory locations according to the invention.

DESCRIPTION OF THE PREFERRED EMBODIMENTS

Referring now to the figures of the drawings in detail and first, particularly, to FIG. 1 thereof, there is shown a memory configuration which includes two memory blocks BK1 and BK2. In each memory block there are column lines and row lines, via which a memory location can be accessed in that a select address is applied to a column decoder and a row decoder, which are connected to the column and row lines. For the sake of providing a better overview, in FIG. 1 only one column line and one row line SL1, ZL1, SL2, ZL2 are represented in each block. In this exemplifying embodiment, the memory configuration also contains two column redundancy lines per block (SRL1 in block BK and SRL2 in block BK2) and two row redundancy lines per block (ZRL1 in block BK1 and ZRL2 in block BK2). The column redundancy lines SRL1 are connected to a programmable column decoder PSD1, and the row redundancy lines ZRL1 are connected to a programmable row decoder PZD1. Likewise, the redundancy lines SRL2 and ZRL2 of the block BK2 are connected to a programmable column decoder PSD2 and a programmable row decoder PZD2, respectively. The programmable decoders PSD1, PZD1, PSD2, PZD2 are connected to a bus line. A select address that is composed of a block select portion b, a column select portion n and a row select portion m is supplied by the bus line. If there are only two blocks present as in the exemplifying embodiment, then the block select portion b can formed of one bit, according to whose status the first or second block is selected. The block select portion b and the column select portion n are supplied to the programmable column decoders PSD1 and PSD2. The row select portion m and likewise the block select portion b of the select address are fed to he programmable row decoders PZD1 and PZD2 via the bus line.

In accessing a defective memory location that is addressed in block BK1, a redundant memory location in block BK1 can be accessed via one of the column redundancy lines SRL1 in order to eliminate the defect. The column decoder PSD1 is then programmed so that instead of the column line that is specified by the column select portion n is being accessed, one of the column redundancy line is accessed.

According to the invention, it is provided that the select address for a particular block can be used to select another block. This means that, in the exemplifying embodiment with the two blocks BK1 and BK2, the aforementioned defect in block BK1 can be eliminated with a redundant memory location in block BK2. To this end, the select portions of the select address that are supplied to the programmable decoders PSD1, PSD2, PZD1, PZD2 are compared to the addresses that are preprogrammed in the decoders. A preprogrammed address is, for example a select address of a defective memory location of a particular block which cannot be replaced with redundant memory locations of the same block because all redundancy lines of this block have already been assigned to a repair. If it is determined in a decoder that the portion of the select address matches the preprogrammed address, then the block appertaining to this decoder is activated and access to the redundant memory locations of this block is opened. Access to all remaining blocks is blocked. In this way, the redundant lines at a particular block can be used for any other block.

For example, in the exemplary embodiment with the two blocks BK1 and BK2, if the block select portion b and the row select portion m match the preprogrammed address of the programmable row decoder PRD2, then the second block BK2 is activated. In this case, it is assumed that the applied select address pertain to a defective memory location of the fist block BK1.

A redundant row address portion m* with which the redundant row that is provided for this select address is coded is assigned to the row select portion m at the row decoder PZD2. The column select portion n of the select address is also valid in block BK2. Thus, access is accomplished not to the defective location in block BK1 that is addressed with n and m but rather to the redundant memory location in block BK2 that is addressed with n and m*. In other words, there is a row redundancy. The row redundancy lines RZL2 of the block BK2 may also be used for additional blocks that may be present. But in this case of row redundancy, the column redundancy lines SRL2 of the block BK2 can only be used in the same block BK2, since otherwise more than one block would have to be activated.

However in the present example it is also possible for a redundant column address portion n to be assigned to the column elect portion n of the select address. For example, this case of column and row redundancy would be conceivable where a separate redundant block was provided whose memory locations were used exclusively to repair memory locations of the other blocks.

For example, if the block select portion b and the column select portion n of the select address matches the preprogrammed address of the programmable column decoder PSD2, then the second block BK2 is activated, and a redundant memory location in block BK2 is accessed via a correspondingly allocated column redundancy line SRL2 and the row select portion m. This column redundancy is analogous to row redundancy. Given column redundancy and row redundancy in a block, all redundant lines—i.e. the row redundancy lines and the column redundancy lines—are made available to another block s repair lines.

In a memory architecture with p-blocks, the described redundancy principle can be expanded to these p-blocks. Regardless of the specific implementation, any memory architecture can be reduced to this sort of subset. If there are s column redundancy lines and z row redundancy lines per block, then up to p.s columns and z rows per block, or s columns and p.z rows, can be exchanged by this redundancy principle. As a rule, the redundant lines that are present in the block itself are used to eliminate defects. If these do not suffice due to the presence of more defects than can be repaired using these lines, then the inventive redundancy principle is additionally applied.

The existing p-blocks can be divided into two sets. In the first set of blocks only the column redundancy lines are used for eliminating defects in another block; in the blocks in the second subset only the row redundancy lines are used. It is not possible to use the column redundancy lines of a first block to repair defects in a second block and to use the row redundancy lines of the first block to repair defects in a third block, for example. Row redundancy lines and column redundancy lines can be used jointly only when both the column redundancy lines and the row redundancy lines are used for one particular block.

The redundancy principle according to the invention, henceforth referred to as interblock redundancy (ZBR), is explained with reference to the flowchart shown in FIG. 2. The starting point of the flowchart is the select address, which, as described, is composed of the block, column, and row select portion b, n and m. In a first step, b and m are compared to the preprogrammed address of the row decoder of a block BK1. Given a match, the abbreviation b(Z)=1 is written to indicate the match; given no match, the abbreviation b(Z)=0 is written to indicate that there is no match. If there is no match (i.e. when b(Z)=0), then in an additional step b and n are compared to the preprogrammed address of the programmable column decoder of the block BK1. If they do not match, i.e. when b(Sp)=0, then no redundancy has been provided for this select address. he block selection occurs via the block select portion b of the applied select address. The memory location is accessed in correspondence to the column select portion n and the row select portion m. The memory location is read or written.

If match is detected in the comparison in the second step, i.e. when b(Sp)=1, then in a third step it is checked whether the column decoder in which the match was detected pertains to the block with the block select portion b of the select address or to a different block. This check is represented in FIG. 2 by b(Sp)=1 identical. In the first case, ordinary redundancy is present; that is, defective memory locations of the block BK1 are repaired by redundant lines of the same block BK1. Here as well, the block selection takes place via the block select portion b of the select address. The redundant memory location of the selected block is accessed. When a column redundancy line is used in this block, access is accomplished with the aid of the row select portion m and redundant column address portion n*. The term n indicates the column address of the column redundancy line that is to be selected. When the removal of the defect is effectuated via the row redundancy line, then access to the redundant memory location in block BK1 is accomplished via the column select portion n and the redundant row address portion m*. When both a row redundancy line and a column redundancy line are used for repair purposes, then the redundant memory location is addressed via the redundant row address portion m* and the redundant column address portion n*. Information is read from or written to the addressed memory location. If the comparison in the first step produces a match, i.e. when b(Z)=1, then in a fourth step an additional interrogation occurs as to whether the row decoder of the matching address belongs to the block with he block select portion b or to another block. This interrogation is represented in an abbreviated manner in FIG. 2 by the block b(Z)=1 identical. If the row decoder does not belong to the block with the block select portion b, then there is interblock redundancy in the row direction. The block selection occurs via the programmable row decoder in which the match with the preprogrammed address exists. The selected block then does not match the block with the block select portion b. In the selected block the redundant memory location is accessed via the column select portion n and the redundant row address portion m*. This is followed by reading from or writing to the memory location.

If in the fourth step it is determined that the row decoder with the matching preprogrammed address belongs to the block that has the block select portion b, then an interrogation occurs a in the third step.

There is interblock redundancy in the column direction when b and n match the preprogrammed address of the column decoder, and this column decoder does not belong to the block with the block select portion b. In this case, access to the redundant memory location is accomplished via the row select portion m and the redundant column address portion n in the block that was assigned to the column decoder beforehand.

The method for accessing the redundant memory locations can be carried out in a parallel or sequential manner. In the parallel method, the block select portion b of the select address is delivered both to the programmable column decoders and the programmable row decoders. If a match is not detected in either decoder, then neither intrablock redundancy nor interblock redundancy is present. If a match is detected in the column decoder or the row decoder of a block, this block is used for interblock redundancy.

In the sequential method, the block select portion b is first conducted only to either the column decoders or the row decoders. It is assumed herein that the comparison of b and m only occurs with the aid of the row decoders. If a match is not detected, then b of the select address is supplied to the column decoders. A final selection of a block is then possible only when the column select portion n is also compared to the preprogrammed address of the column decoder.

If a match is detected in the comparison using the row decoders, there is redundancy in the row direction. There may also be redundancy in the column direction. If there is not redundancy in the column direction, then that block is valid which was specified via the redundancy in the row direction. If the redundancy in the row direction is an interblock redundancy, (i.e. the active block does not match the block select portion b and there is additional redundancy in the column direction), then it is guaranteed by blockage of the remaining inactive blocks that the programmable column decoder does not bring about the selection of a block other than that which has been prescribed by the programmable row decoder. If the redundancy in the row direction is not an interblock redundancy, then, given redundancy in the column direction, this redundancy in the column direction, through the use of the column fuse coding, can be taken as an interblock redundancy.

In summary, the following conditions can be established for the method according to the invention:
A) If an interblock redundancy in a subset of the p-blocks under consideration is selected or required, this redundancy can be activated either in the column direction or in the row direction. For the remaining blocks, additional subsets can be formed with the interblock redundancy selected differently, until all p-blocks are covered by interblock redundancy in case this is necessary.

B) The redundancy lines within a block X which are used for another block Y on the basis of interblock redundancy can no longer be used for block X, though those that are not used for block Y can.

C) All addresses that are coded via b and n throughout all p-block must differ, as must all addresses that are coded via b and m, so that only one memory block can be activated with a given address.

We claim:

1. A memory configuration, comprising:
   row redundancy lines and column redundancy lines crossing each other at cross-over points;
   memory blocks having memory locations and redundant memory locations disposed at said cross-over points;
   said memory locations and said redundant memory locations being organized in rows and columns and being selectable via respective select addresses;
   a programmable row decoder for selecting said row redundancy lines and a programmable column decoder for selecting said column redundancy lines respectively allocated to each of said memory blocks for selecting one of said redundant memory locations in a respective one of said memory blocks;
   at least one of said programmable column decoder and said programmable row decoder of at least a given one of said memory blocks being programmed such that said given one of said memory blocks can be selected with a select address corresponding to another one of said memory blocks for accessing given ones of said redundant memory locations assigned to said given one of said memory blocks;
   said programmable column decoder and said programmable row decoder allocated to said given one of said memory blocks each including a comparing device for comparing a given portion of the select address to a corresponding preprogrammed address; and
   said programmable column decoder and said programmable row decoder allocated to said given one of memory blocks being configured such that said programmable column decoder performs a comparison of the select address with the corresponding preprogrammed address only when said programmable row decoder has not detected a match between the select address and the corresponding preprogrammed address.

2. The memory configuration according to claim 1, wherein said comparing device of said programmable column decoder and said comparing device of said programmable row decoder allocated to said given one of said memory blocks are configured to deny access to said memory locations for said memory blocks except for said given one of said memory blocks, if the comparison of the select address to the corresponding preprogrammed address produces a match.

3. The memory configuration according to claim 2, wherein:
   the select address has a first portion for selecting one of said memory blocks, a second portion for selecting one of said columns, and a third portion for selecting one of said rows;
   said comparing device of said programmable column decoder allocated to said given one of said memory blocks compares the first portion and the second portion of the select address to the corresponding preprogrammed address; and said comparing device of said programmable row decoder allocated to said given one of said memory blocks compares the first portion and the third portion of the select address to the corresponding preprogrammed address.

4. A method of accessing redundant memory locations, the method which comprises:

providing memory locations organized in columns and rows in a memory configuration having memory blocks;

allocating programmable column decoders for selecting column redundancy lines and programmable row decoders for selecting row redundancy lines to the memory blocks;

replacing a given one of the memory locations of a given one of the memory blocks by a redundant memory location of another one of the memory blocks by performing a comparison of a select address of the given one of the memory locations with a respective preprogrammed address of each of the programmable column decoders and with a respective preprogrammed address of each of the programmable row decoders; and performing the comparison with the respective preprogrammed address of the column decoders only when the comparison with the respective preprogrammed address of the row decoders does not result in a match.

5. The method of accessing redundant memory locations according to claim 4, which comprises:

selecting the memory blocks with a first portion of the select address;

selecting the columns of redundant memory locations with a second portion of the select address;

selecting the rows of the redundant memory locations with a third portion of the select address;

comparing the first portion and the second portion of the select address to the respective preprogrammed address of each of the programmable column decoders; and comparing the first portion and the third portion of the select address to the respective preprogrammed address of each of the programmable row decoders.

6. The method of accessing redundant memory locations according to claim 5, which comprises enabling access to the redundant memory locations of a specific one of the memory blocks if a match exists for a corresponding portion of the select address and the respective preprogrammed address in one of the column decoders allocated to the specific one of the memory blocks.

7. The method of accessing redundant memory locations according to claim 6, which comprises allocating a new address to the second portion of the select address for accessing one of the redundant memory locations.

8. The method of accessing redundant memory locations according to claim 6, which comprises allocating a new address to the third portion of the select address for accessing one of the redundant memory locations.

9. The method of accessing redundant memory locations according to claim 6, which comprises allocating a new address to the second portion and the third portion of the select address for accessing one of the redundant memory locations.

10. Th method of accessing redundant memory locations according to claim 5, which comprises enabling access to the redundant memory locations of a specific one of the memory blocks if a match exists for a corresponding portion of the select address and the respective preprogrammed address in one of the row decoders allocated to the specific one of the memory blocks.

11. The method of accessing redundant memory locations according to claim 10, which comprises allocating a new address to the second portion of the select address for accessing one of the redundant memory locations.

12. The method of accessing redundant memory locations according to claim 10, which comprises allocating a new address to the third portion of the select address for accessing one of the redundant memory locations.

13. The method of accessing redundant memory locations according to claim 10, which comprises allocating a new address to the second portion and the third portion of the select address for accessing one of the redundant memory locations.

* * * * *